US012327764B2

(12) United States Patent
Lin et al.

(10) Patent No.: US 12,327,764 B2
(45) Date of Patent: Jun. 10, 2025

(54) TWO-DIMENSION SELF-ALIGNED SCHEME WITH SUBTRACTIVE METAL ETCH

(71) Applicant: Applied Materials, Inc., Santa Clara, CA (US)

(72) Inventors: Yung-chen Lin, Gardena, CA (US); Chi-I Lang, Cupertino, CA (US); Ho-yung Hwang, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 538 days.

(21) Appl. No.: 17/859,838

(22) Filed: Jul. 7, 2022

(65) Prior Publication Data

US 2023/0033038 A1 Feb. 2, 2023

Related U.S. Application Data

(60) Provisional application No. 63/296,437, filed on Jan. 4, 2022, provisional application No. 63/227,821, filed on Jul. 30, 2021.

(51) Int. Cl.
*H01L 21/768* (2006.01)
*H01L 21/033* (2006.01)
*H01L 23/522* (2006.01)

(52) U.S. Cl.
CPC .... *H01L 21/76897* (2013.01); *H01L 21/0332* (2013.01); *H01L 21/0335* (2013.01); *H01L 21/0337* (2013.01); *H01L 21/0338* (2013.01); *H01L 23/5226* (2013.01)

(58) Field of Classification Search
CPC ........... H01L 21/76897; H01L 21/0332; H01L 21/0335; H01L 21/0337; H01L 21/0338; H01L 23/5226; H01L 21/76879; H01L 21/76885; H01L 21/76834; H01L 21/32139; H01L 21/76877; H01L 23/5283; H01L 31/0337
See application file for complete search history.

(56) References Cited

U.S. PATENT DOCUMENTS

| | | | |
|---|---|---|---|
| 5,592,024 | A | 1/1997 | Aoyama et al. |
| 6,869,879 | B1 | 3/2005 | Ryan |
| 7,160,814 | B2 | 1/2007 | Hwang et al. |
| 9,431,297 | B2 | 8/2016 | Wu et al. |
| 9,997,404 | B2 | 6/2018 | Wu et al. |
| 10,490,442 | B2 | 11/2019 | Chan et al. |
| 10,840,138 | B2 | 11/2020 | Lin et al. |
| 10,937,652 | B1 | 3/2021 | Tien et al. |

(Continued)

OTHER PUBLICATIONS

International Search Report and Written Opinion dated Nov. 7, 2022 for Application No. PCT/US2022/036387.

*Primary Examiner* — Christine S. Kim
*Assistant Examiner* — Andrew Victor Prostor
(74) *Attorney, Agent, or Firm* — Patterson + Sheridan, LLP

(57) ABSTRACT

Methods for formation of a layer stack during a back-end-of-line (BEOL) process flow and the layer stack formed therefrom are provided. In one or more embodiments, the method utilizes a two-dimensional (2D) self-aligned scheme with a subtractive metal etch. The method includes using a hard mask to form a via with a small width which is formed through or contacts each of a first metal layer and a second metal layer. The via is filled with a metal gapfill to connect the first metal layer and the second metal layer. Each of the first metal layer and the second metal layer are patterned to form a plurality of features.

17 Claims, 8 Drawing Sheets

(56) References Cited

U.S. PATENT DOCUMENTS

| | | |
|---|---|---|
| 11,170,992 B2 | 11/2021 | Tapily et al. |
| 2004/0178169 A1 | 9/2004 | Desphande et al. |
| 2005/0153535 A1 | 7/2005 | Hwang et al. |
| 2016/0099174 A1 | 4/2016 | Wu et al. |
| 2016/0148869 A1 | 5/2016 | Schenker et al. |
| 2016/0365276 A1 | 12/2016 | Wu et al. |
| 2017/0330761 A1 | 11/2017 | Chawla et al. |
| 2018/0240699 A1 | 8/2018 | Chan et al. |
| 2019/0088543 A1 | 3/2019 | Lin et al. |
| 2019/0333763 A1 | 10/2019 | Tapily et al. |
| 2021/0082698 A1 | 3/2021 | Tien et al. |
| 2021/0183654 A1 | 6/2021 | Tien et al. |

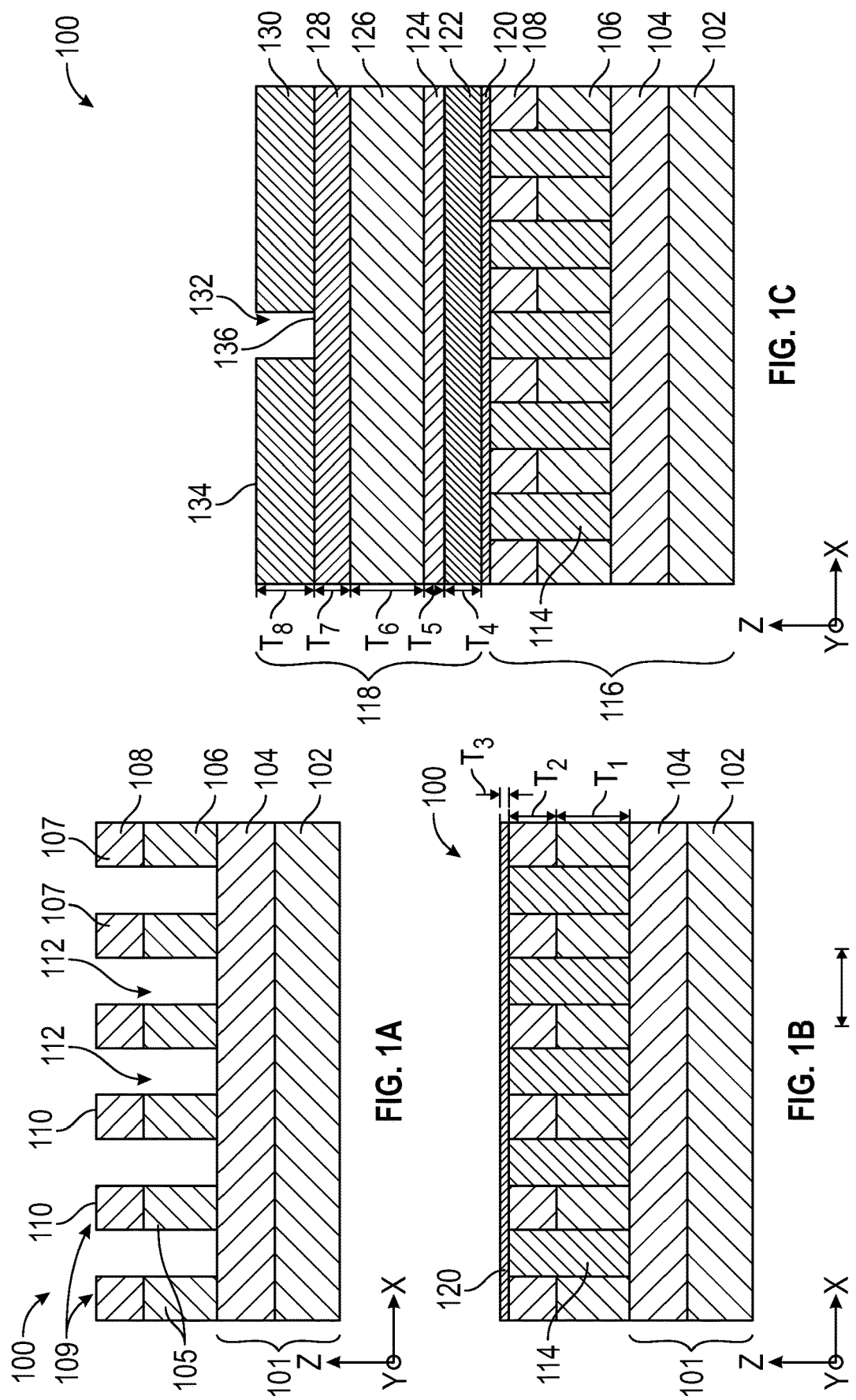

TWO-DIMENSION SELF-ALIGNED SCHEME WITH SUBTRACTIVE METAL ETCH

CROSS-REFERENCE TO RELATED APPLICATIONS

This application claims benefit to U.S. Appl. No. 63/227,821, filed on Jul. 30, 2021, and U.S. Appl. No. 63/296,437, filed on Jan. 4, 2022, which are herein incorporated by reference in their entirety.

BACKGROUND

Field

Embodiments of the present disclosure generally relate to fabrication of microelectronic devices, and more specifically, relate to back end of line (BEOL) processes during the fabrication of microelectronic devices.

Description of the Related Art

Integrated circuits are made possible by processes which produce intricately patterned material layers on substrate surfaces. Producing patterned material on a substrate requires controlled methods for deposition and removal of material. Plasma dry etching is used for a variety of purposes including transferring a pattern in photoresist into underlying layers, thinning layers, or thinning lateral dimensions of features already present on the surface. In some embodiments, etching is performed through a hard mask to improve etch accuracy. Layer formation and etching is performed to achieve desired end device structures.

As a result of the diversity of materials, circuits, and processes, the layer formation and etch operations have become increasingly complex, the size of device features has been reduced, and more complex device structures are needed. As device structures become more complex, alignment of features within the layers has become increasingly difficult. This is further complicated as the desired feature size has decreased.

Therefore, there is a need for a method to perform back end of line (BEOL) processes which improve the accuracy and alignment of etching operations.

SUMMARY

The present disclosure generally relates to a method of processing a substrate. The method is suitable for semiconductor manufacturing, such as manufacturing of logic or memory semiconductor devices. The method includes depositing a first oxide layer over a patterned hard mask layer. A first portion of a via is etched through the first oxide layer and through an opening within the patterned hard mask layer. A second portion of the via is etched through an upper metal layer and one or more low-k material layers to expose a portion of a lower metal layer. The one or more low-k material layers are disposed between the upper metal layer and the lower metal layer. The second portion of the via is gap-filled with a gapfill metal. The first portion of the via is filled with a second oxide layer. A portion of the first oxide layer and the second oxide layer is removed to form a patterned layer. The patterned hard mask layer is removed to form openings within the patterned layer. A portion of the upper metal layer is etched through the openings within the patterned layer after removing the patterned hard mask layer.

In another embodiment, a method of processing a substrate, suitable for semiconductor manufacturing, includes depositing a low temperature oxide layer over a patterned hard mask layer. The patterned hard mask layer includes a plurality of openings and the low temperature oxide layer is disposed within the plurality of openings. A first portion of a via is etched through the low temperature oxide and through an opening within the patterned hard mask layer. A second portion of the via is etched through an upper metal layer, an insulating layer, a low-k layer, and a blocking layer to expose a portion of a lower metal layer. The second portion of the via is gap-filled with a gapfill metal to connect the upper metal layer and the lower metal layer.

In yet another embodiment, a layer stack disposed on a substrate, suitable for use as a semiconductor, is described. The layer stack includes a first metal layer. A first hard mask layer is disposed on the first metal layer. One or more low-k material layers are disposed over the first hard mask layer. A second metal layer is disposed over the one or more low-k material layers and the first hard mask layer. A second hard mask layer is disposed over the second metal layer. An oxide layer is disposed over the second hard mask layer. Each of the second metal layer, the second hard mask layer, and the oxide layer are patterned and form a plurality of features. A gapfill metal connects the first metal layer and the second metal layer and is disposed through an opening within the first hard mask and the one or more low-k material layers.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of the scope of the disclosure, as the disclosure may admit to other equally effective embodiments.

FIGS. 1A-1C depict schematic cross-sectional first side views of a layer stack, according to one or more embodiments described and discussed herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 2B:
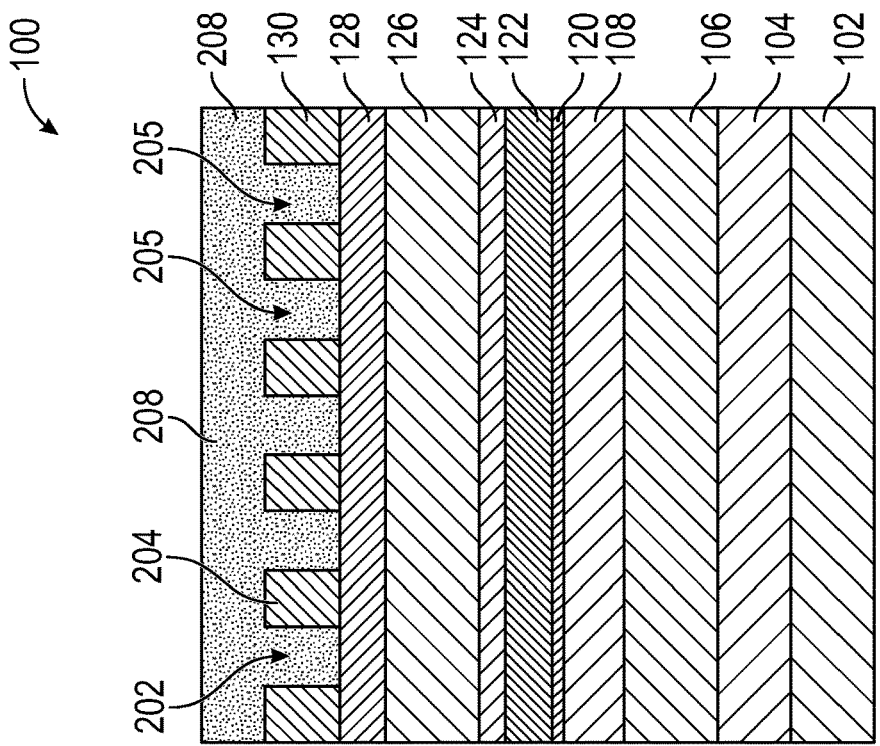
FIGS. 2A-2I depict schematic cross-sectional second side views of the layer stack of FIGS. 1A-1C, according to one or more embodiments described and discussed herein.

The present disclosure generally relates to a method for forming a semiconductor device. The method is more specifically directed towards the formation of a layer stack during a back-end-of-line (BEOL) process flow. The method utilizes a 2-dimensional (2D) self-aligned scheme with a subtractive metal etch. The methods described herein enable 2D self-alignment of a via to both a first metal layer and a second metal layer formed as separate layers within the layer stack. The methods described herein are compatible with current dual damascene self-aligned titanium nitride hard mask patterning. The methods described herein are beneficial for small pitch patterning, such as ultra-small pitch patterning. Ultra-small pitch patterning includes pitch patterning of less than or about 22 nm, such as less than or about 20 nm, such as less than or about 18 nm, such as less than or about 15 nm.

The methods described herein further include a first self-aligned double patterning process and a subtractive metal etch of a first metal layer within a lower portion of a film stack. A silicon nitride hard mask layer is disposed on top of the first metal layer and is used as a chemical mechanical polishing (CMP) stop layer. Once the features formed during the subtractive metal etch have been filled with a gap-fill material, an upper portion of the film stack is formed over the lower portion. The upper portion includes a second metal layer.

Once the upper portion is formed on the lower portion, a second self-aligned double patterning process is performed. The second self-aligned double patterning process includes transferring a pattern into a titanium nitride or a tungsten carbide hard mask layer. The titanium nitride or tungsten carbide hard mask layer is disposed on top of the second metal layer and an upper silicon nitride hard mask layer. Via patterning is performed through openings within the titanium nitride or tungsten carbide hard mask layer to form one or more vias. Via patterning etches through each of the upper silicon nitride hard mask layer, the second metal layer, and one or more additional layers disposed between the second metal layer and the first metal layer. Via patterning exposes a portion of the first metal layer. The alignment of the one or more vias to the first metal layer is achieved using selective etch of the silicon nitride performed during earlier operations, while the use of the titanium nitride or tungsten carbide mask aligns the via etch with the second metal layer.

A lower portion of the one or more vias is filled with a metal gapfill material to connect the first metal layer and the second metal layer. A metal etching process is used to adjust the height of the metal gapfill material in the via. An upper portion of the one or more vias is filled with a low temperature oxide. The low temperature oxide is utilized to reverse the tone of the titanium nitride or tungsten carbide mask, such that the titanium nitride or tungsten carbide mask is removed to leave the reverse tone low temperature oxide pattern. The reverse tone low temperature oxide pattern is utilized to etch the second metal layer and form a plurality of features.

Figure 3:
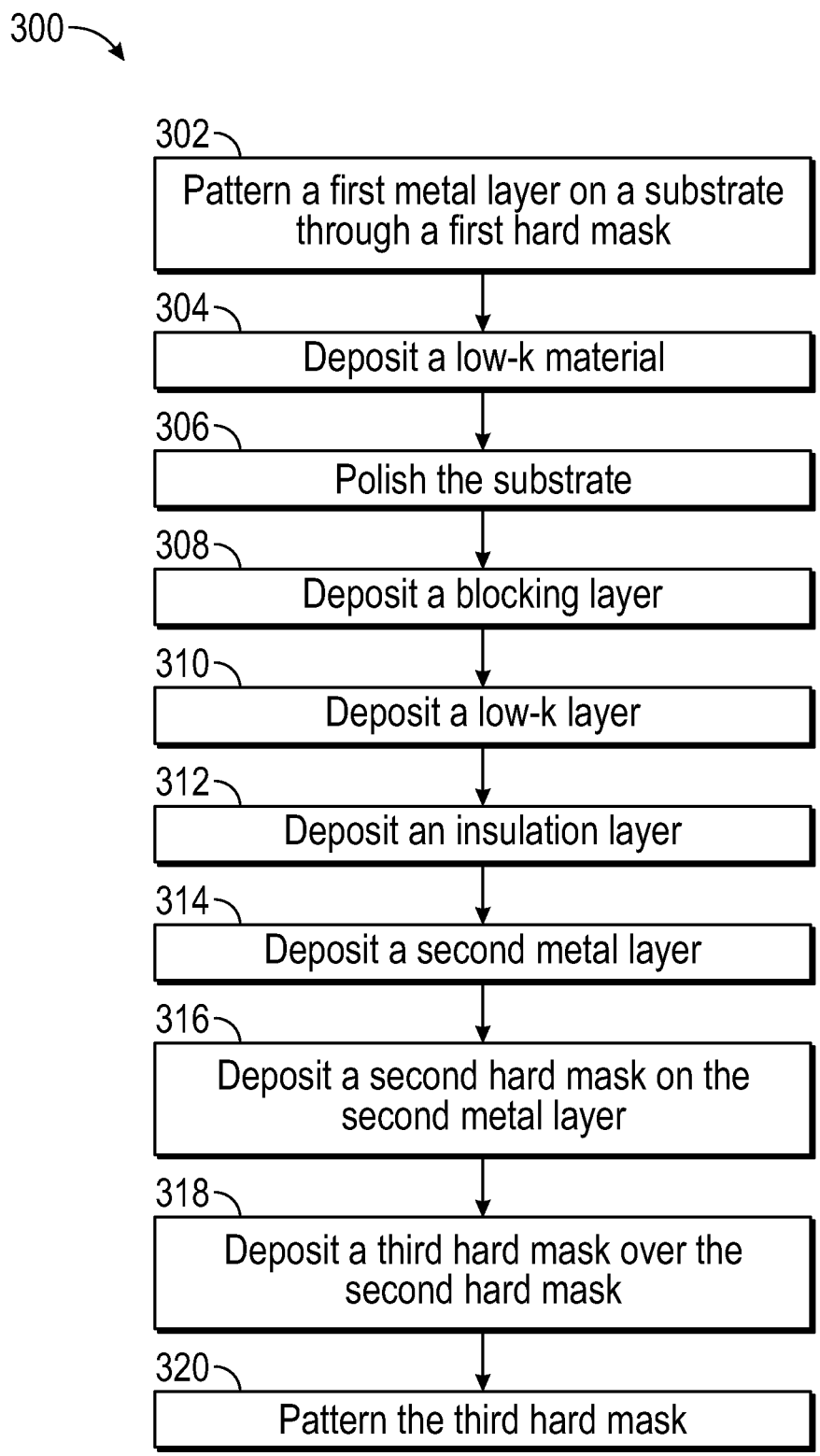
FIG. 3 is a flow chart depicting a method for forming the layer stack of FIGS. 1A-1C, according to one or more embodiments described and discussed herein.

FIGS. 1A-1C illustrate schematic cross-sectional first side views of a layer stack 100. FIG. 3 illustrates a first method 300 of forming the layer stack 100 of FIGS. 1A-1C, according to one or more embodiments. In the following description, the layer stack 100 and the first method 300 of forming the layer stack 100 are described together with reference to the respective FIGS. 1A-1C and FIG. 3. The layer stack 100 is formed on top of a substrate 101. The substrate 101 includes a plurality of layers. The substrate 101 includes a plurality of front end of line (FEOL) layers 102 and a plurality of middle of line (MOL) layers 104. The FEOL layers 102 include transistors, capacitors, or other layers formed during FEOL processing. The MOL layers 104 include contact structures configured to be disposed between the FEOL layers 102 and a plurality of back-end of line (BEOL) layers. The MOL layers 104 are disposed on top of the FEOL layers 102.

The layer stack 100 further includes a first metal layer 106 disposed on top of the substrate 101. A first hard mask layer 108 is disposed on top of the first metal layer 106. The first hard mask layer 108 is patterned and forms a first hard mask 107. The first hard mask 107 includes a plurality of openings 112 disposed therein. In some embodiments, the first metal layer 106 and the first hard mask layer 108 are described as a lower metal layer or a lower hard mask layer respectively.

The first metal layer 106 is a transition metal layer. In some embodiments, the first metal layer 106 includes ruthenium, molybdenum, tungsten, alloys thereof, or any combination thereof. In one or more embodiments, the first metal layer 106 is an alloy of one of ruthenium, molybdenum, or tungsten. In other embodiments, the first hard mask layer 108 is a nitride layer, such as a silicon nitride layer.

Referring to FIG. 3 and FIG. 1A, during an operation 302 of the first method 300, the first metal layer 106 is patterned through the first hard mask 107 to form a plurality of first metal features 105. The first metal features 105 include the plurality of openings 112 disposed therebetween. The first metal features 105 and the first hard mask 107 form a plurality of first features 109. The plurality of first features 109 include one of the plurality of openings 112 disposed between each adjacent first feature 109. The plurality of first features 109 have a first feature pitch. The first feature pitch is less than or about 25 nm, such as less than or about 20 nm, such as less than or about 18 nm, such as less than or about 15 nm.

Referring further to FIG. 1B, during another operation 304, the openings 112 between the first features 109 are filled with a low-k material 114, such that the low-k material 114 is deposited within each opening 112 between each of the first metal features 105 and the openings 112 within the first hard mask 107. The low-k material 114 is a material with a dielectric constant of less than or about 4, such as less than or about 3.5, such as less than or about 3. The low-k material 114 may include silicon dioxide ($SiO_2$), doped silicon dioxide, carbon doped silicon dioxide, or combinations thereof.

Once the low-k material 114 has been deposited during the operation 304, a top surface 110 of the first hard mask layer 108 and the low-k material 114 are polished during an operation 306. The polishing of the first hard mask layer 108 and the low-k material 114 during an operation 306 planarizes the first hard mask layer 108 and the low-k material 114. The polishing during the operation 306 may be a chemical mechanical polishing (CMP). The thickness of the first hard mask layer 108 may be reduced during the operation 306, such that the thickness of the first hard mask layer 108 decreases by about 1 nm to about 10 nm, such as about 2 nm to about 8 nm, such as about 4 nm to about 6 nm. At least a portion of the first hard mask layer 108 is kept after the polishing operation to protect the first metal layer 106.

After planarization of the first hard mask layer 108 and the low-k material 114, a blocking layer 120 is deposited on top of the planar top surface 110 of the first hard mask layer 108 and the low-k material 114 during an operation 308. The blocking layer 120 is configured to cap the low-k material 114 and the first hard mask layer 108 to prevent the exposure of the low-k material and the first hard mask layer 108 to moisture. The blocking layer 120 further provides a uniform layer for subsequent layer growth. The blocking layer 120 may be a metal oxide layer, such as an aluminum oxide layer or a gallium oxide layer. The blocking layer 120 may further be a metal nitride layer, such as aluminum nitride, or silicon carbon-nitride. In some embodiments, the blocking layer 120 is a metal oxide and metal nitride layer stack, such as one or more alternating layers of aluminum oxide and aluminum nitride.

The first metal layer 106 has a first thickness $T_1$ after formation of the blocking layer 120. The first thickness $T_1$ is about 15 nm to about 40 nm, such as about 20 nm to about 35 nm, such as about 20 nm to about 30 nm, such as about 25 nm. The first hard mask layer 108 has a second thickness $T_2$ after formation of the blocking layer 120. The second thickness $T_2$ is about 1 nm to about 15 nm, such as about 4 nm to about 12 nm, such as about 5 nm to about 10 nm, such as about 5 nm. The blocking layer 120 has a third thickness $T_3$ after the operation 308. The third thickness $T_3$ is less than or about 10 nm, such as about 0.5 nm to about 10 nm, such as about 1 nm to about 5 nm, such as about 2 nm to about 4 nm, such as about 3 nm. In some embodiments, the third thickness $T_3$ is less than or about 3 nm, such as less than or about 2 nm.

Referring further to FIG. 1C, the blocking layer 120, the first hard mask layer 108, the first metal layer 106, the MOL layers 104, and the FEOL layers 102 form a lower portion 116 of the layer stack 100. An upper portion 118 is formed on top of the lower portion 116 after the deposition of the blocking layer 120 during the operation 308. The upper portion 118 includes a low-k layer 122, an insulation layer 124, a second metal layer 126, a second hardmask layer 128, and a third hardmask layer 130.

The upper portion 118 is formed by first depositing the low-k layer 122 on top of the blocking layer 120 during an operation 310. The low-k layer 122 is deposited directly on top of the blocking layer 120. The low-k layer 122 has a dielectric constant of less than or about 4, such as less than or about 3.5, such as less than or about 3. The low-k layer 122 may include silicon dioxide ($SiO_2$), doped silicon dioxide, and/or carbon doped silicon dioxide. The low-k layer 122 is a porous material. The low-k layer 122 has a dielectric constant of less than or about 3.5, such as less than or about 3, such as about 2.3 to about 3. In some embodiments, the dielectric constant of the low-k layer 122 is less than or about 2.3.

After depositing the low-k layer 122 during the operation 310, the insulation layer 124 is deposited on top of the low-k layer 122 during an operation 312. The insulation layer 124 is a second low-k layer and is deposited directly on the low-k layer 122. The insulation layer 124 has a higher density than the low-k layer 122 and therefore reduces metal diffusion into the low-k layer 122 from the second metal layer 126 disposed above the insulation layer 124. Both of the low-k layer 122 and the insulation layer 124 increase the capacitance of the structure within the layer stack 100. The insulation layer 124 is a low-temperature oxide layer. The insulation layer 124 has a dielectric constant of less than or about 4, such as less than or about 3.5, such as less than or about 3. The insulation layer 124 may include silicon oxycarbide, silicon oxycarbonitride, boron nitride, tetraethyl orthosilicate (TEOS), dopants thereof, or any combination thereof. In some embodiments, the insulation layer 124 and the low-k layer 122 are referred together as one or more low-k material layers. In some embodiments, additional low-k material layers may be disposed between the blocking layer 120 and the second metal layer 126.

The second metal layer 126 is disposed on top of the insulation layer 124 during another operation 314. The second metal layer 126 is disposed directly on top of the insulation layer 124. The second metal layer 126 is a similar material to the first metal layer 126, such that the second metal layer 126 includes ruthenium, molybdenum, tungsten, alloys thereof, or any combination thereof. In some embodiments, the second metal layer 126 is an alloy of one of ruthenium, molybdenum, or tungsten. The second metal layer 126 is a continuous layer disposed over the insulation layer 124.

After the formation of the second metal layer 126 during the operation 314, the second hard mask 128 is deposited on top of the second metal layer 126 during another operation 316. The second hard mask 128 is a similar material to the first hard mask 108, such that the second hard mask 128 includes a nitride layer, such as a silicon nitride layer. The second hard mask 128 is a continuous layer during and immediately following deposition during the operation 316. In some embodiments, the second metal layer 126 and the second hard mask layer 128 are described as an upper metal layer or an upper hard mask layer respectively. The second hard mask 128 serves as an under stop layer, such as an etch stop layer to stop the etch of the third hard mask 130 before transferring of the pattern of the third hard mask 130 through the layer stack 100.

The third hard mask 130 is deposited on top of the second hard mask 128 during an operation 318. The third hard mask 130 is disposed directly on top of the second hard mask 128. The third hard mask 130 is a nitride or a carbide hard mask. In some embodiments, the third hard mask 130 is a titanium nitride or a tungsten carbide hard mask. In some embodiments, the third hard mask 130 is a metal carbide which is easy to remove with a wet etch process, such as a titanium nitride (TiN), a tungsten carbide (WC), a titanium carbide (TiC), or a ruthenium carbide (RuC) hard mask.

After depositing the third hard mask 130, the third hard mask 130 is patterned during an operation 320. Patterning the third hard mask 130 may be performed by exposing portions of the third hard mask 130 to one or more radiation sources. Patterning the third hard mask 130 further includes removing portions of the third hard mask 130 to form openings 132. The openings 132 are disposed through the third hard mask 130 and expose a top surface 136 of the second hard mask 128. Therefore, the openings 132 extend from the top surface 134 of the third hard mask 132 to the top surface 136 of the second hard mask 128. In some embodiments, the third hard mask 130 is patterned using a lithographic process.

After formation of the third hard mask 130, the low-k layer has a fourth thickness $T_4$. The fourth thickness $T_4$ is about 3 nm to about 20 nm, such as about 5 nm to about 15 nm, such as about 7 nm to about 13 nm, such as about 10 nm. After formation of the third hard mask 130, the insulation layer 124 has a fifth thickness $T_5$. The fifth thickness $T_5$ is about 3 nm to about 20 nm, such as about 5 nm to about 15 nm, such as about 7 nm to about 13 nm, such as about 10 nm. After formation of the third hard mask 130, the second metal layer 126 has a sixth thickness $T_6$. The sixth thickness $T_6$ is about 15 nm to about 40 nm, such as about 20 nm to about 35 nm, such as about 20 nm to about 30 nm, such as about 25 nm. After formation of the third hard mask 130, the second hard mask 128 has a seventh thickness $T_7$. The seventh thickness $T_7$ is about 2 nm to about 20 nm, such as about 5 nm to about 15 nm, such as about 8 nm to about 13 nm, such as about 10 nm. The third hard mask 130 has an eighth thickness $T_8$. The eighth thickness $T_8$ is about 5 nm to about 40 nm, such as about 10 nm to about 30 nm, such as about 15 nm to about 25 nm, such as about 20 nm.

FIGS. 1A-1C illustrate the layer stack 100 in a first orientation, such that the layer stack 100 is being viewed through an x-z plane, where a y-direction is orthogonal to each of the x-direction and the z-direction. When viewed through a y-z plane (FIG. 2A), additional openings 202 within the third hard mask 130 are viewed. The openings 202 are disposed from the top surface 134 of the third hard mask 132 to the top surface 136 of the second hard mask 128. The openings 202 are disposed between portions 204 of the third hard mask 130, such that each portion 204 includes a sidewall 206 extending from the top surface 134 of the third hard mask 132 to the top surface 136 of the second hard mask 128.

Figure 2A:
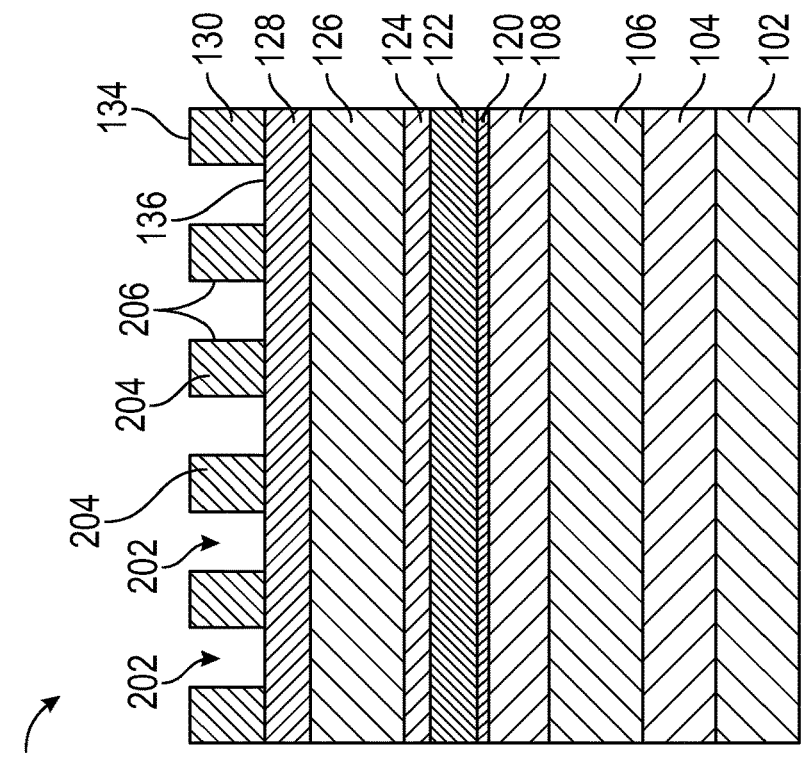
Figure 2D:
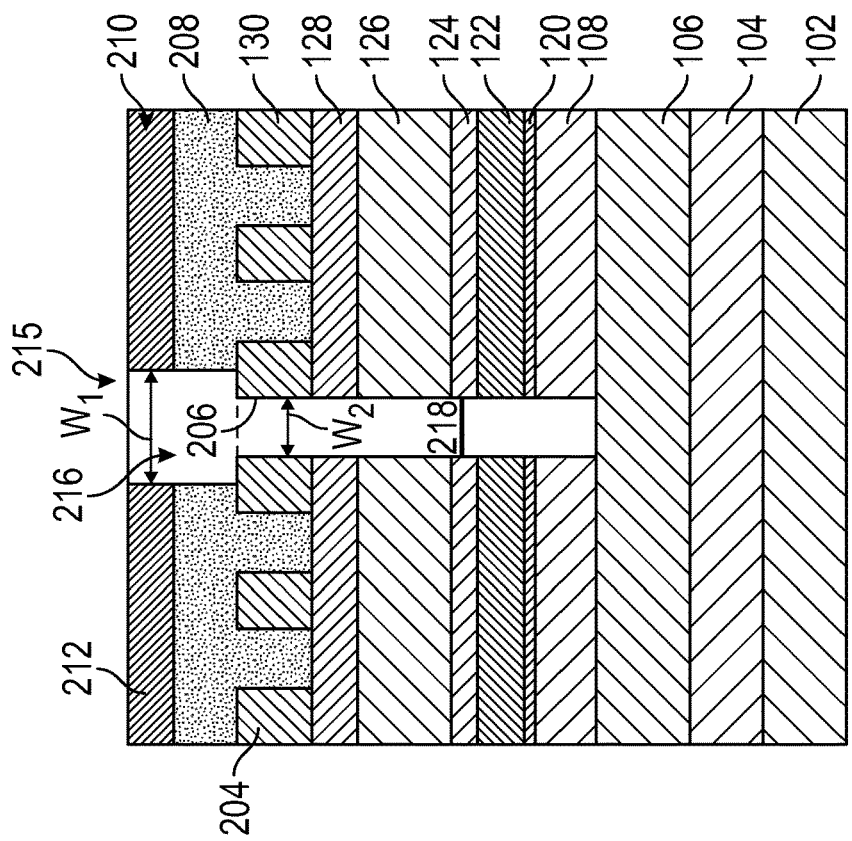
Figure 2C:
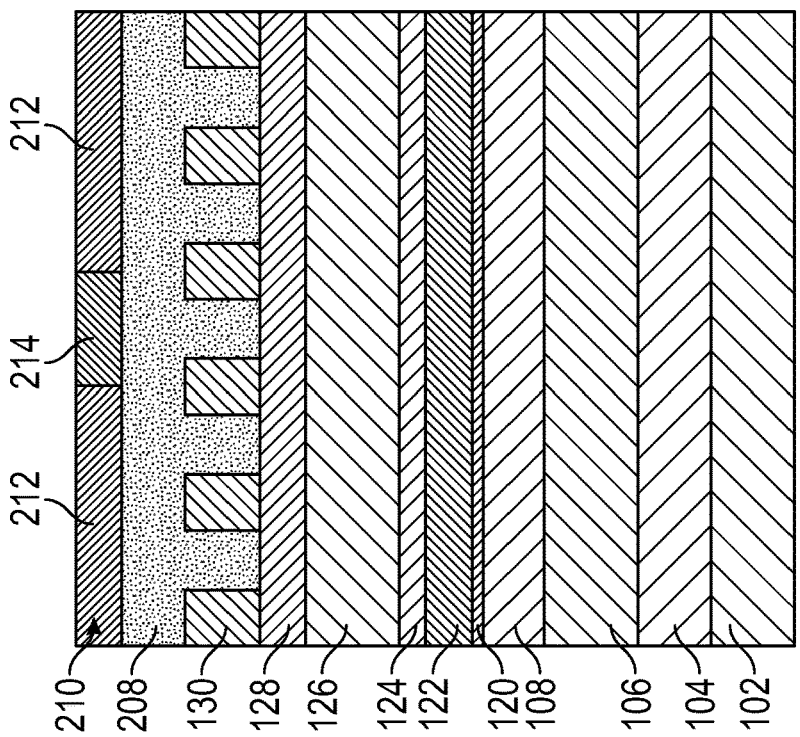
Figure 2F:
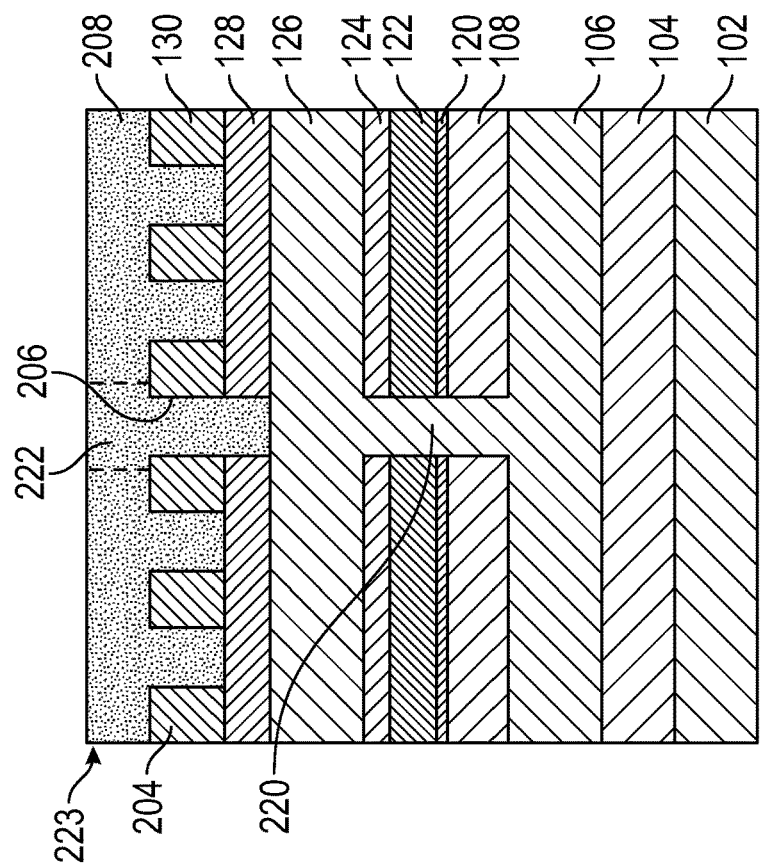
Figure 2E:
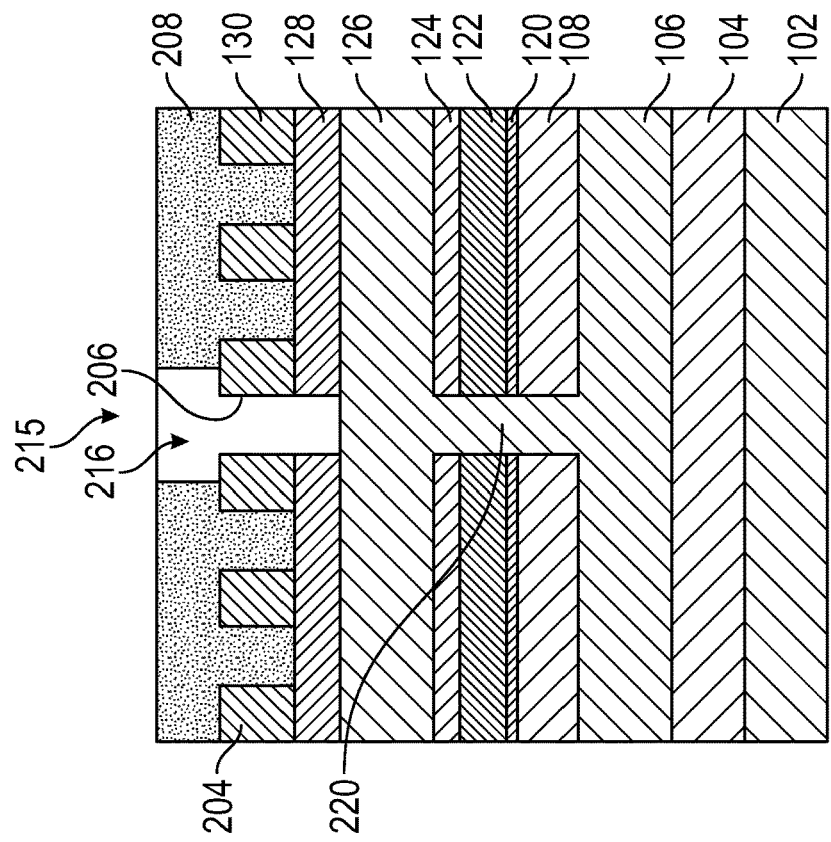
Figure 2H:
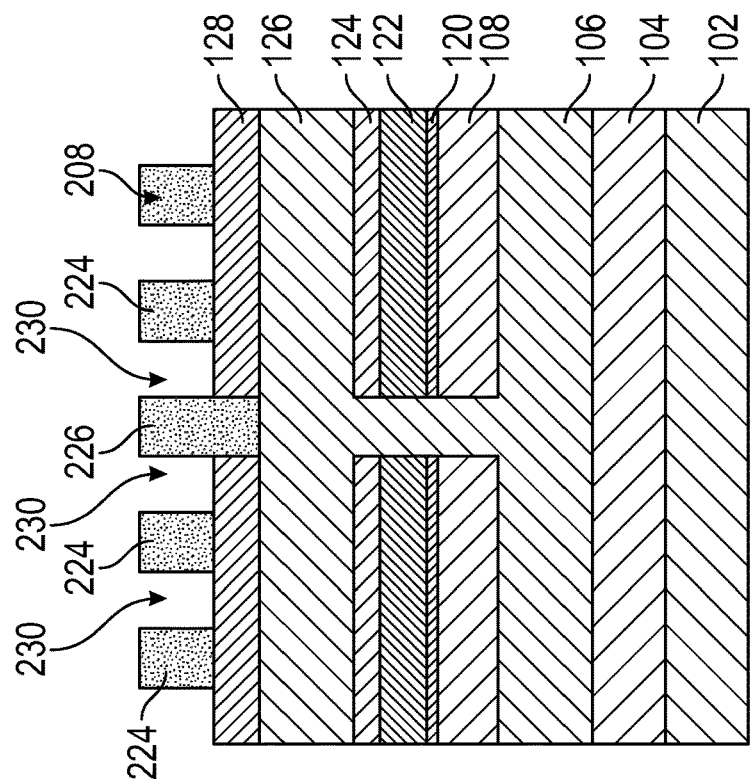
Figure 2G:
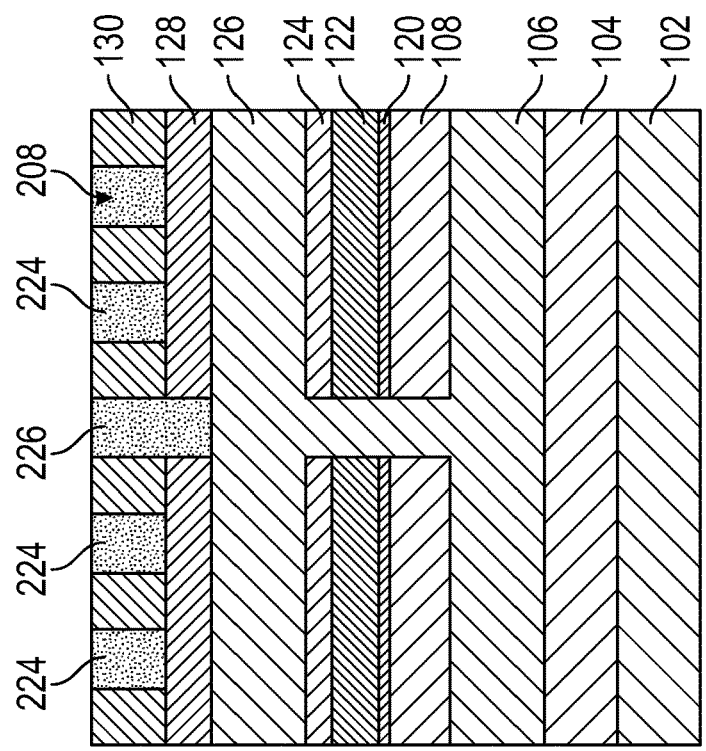
Figure 2I:
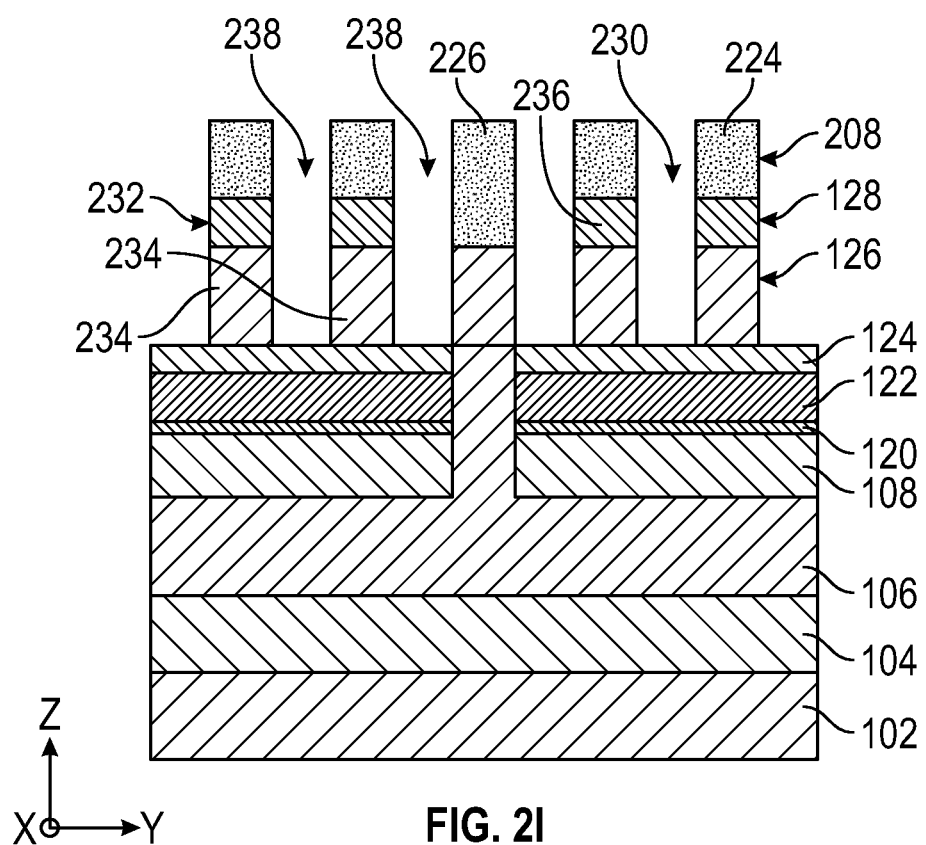
Figure 4:
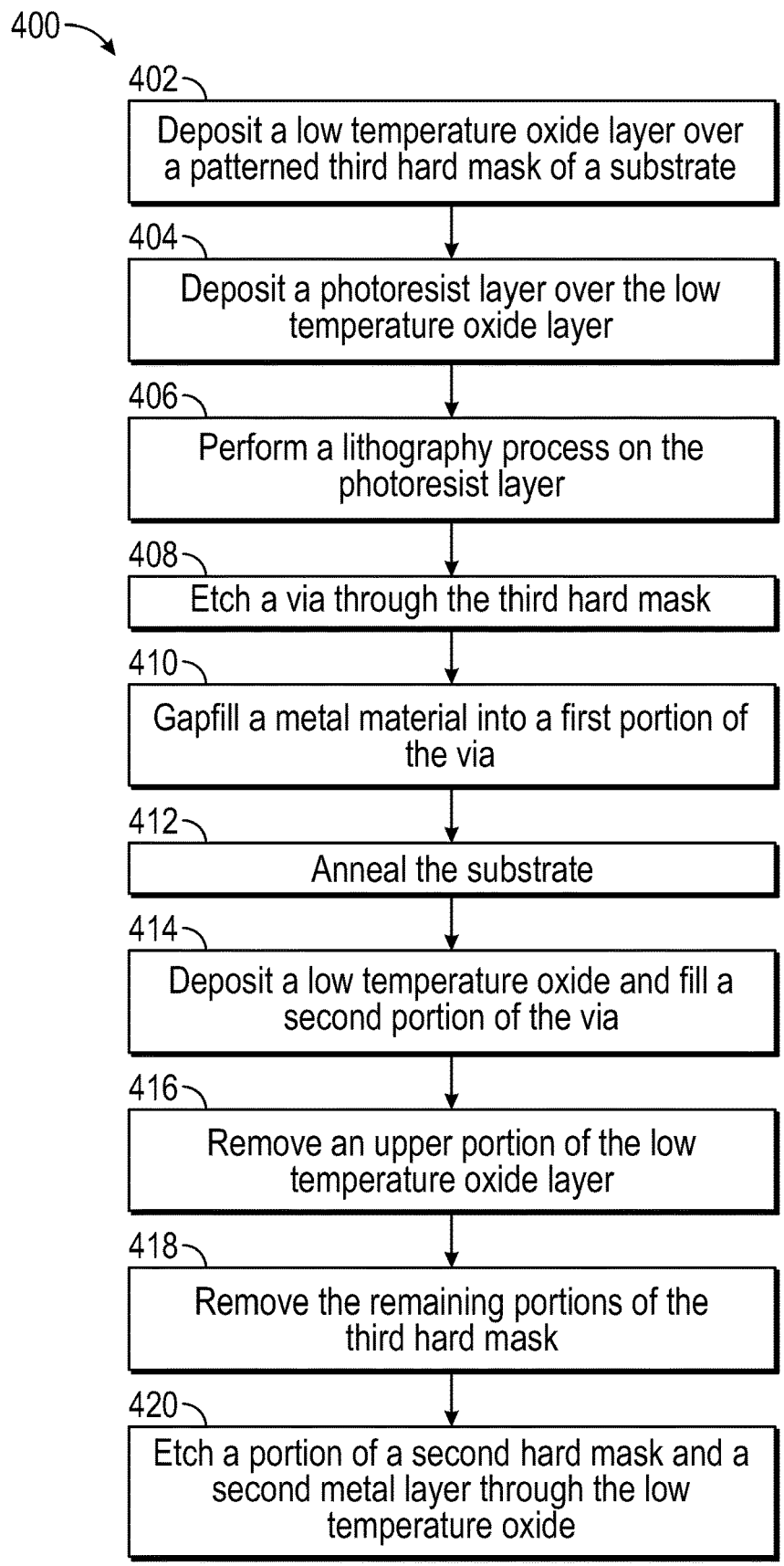
FIG. 4 is a flow chart depicting a method for forming the layer stack of FIGS. 2A-2I, according to one or more embodiments described and discussed herein.

FIGS. 2A-2I illustrate schematic cross-sectional second side views of the layer stack 100 of FIGS. 1A-1C through the y-z plane. FIG. 4 illustrates the method 400 of forming the layer stack 100 of FIGS. 2A-2I. After the method 300 of FIG. 3 and the patterning of the third hard mask 130, the method 400 is performed on the layer stack 100 to form an interconnect 220 (FIG. 2E) between the first metal layer 106 and the second metal layer 126 and a plurality of second features 232 (FIG. 2I).

Referring to FIG. 4 and FIG. 2B, after formation of the pattern of the third hard mask 130, a low temperature oxide layer 208 is deposited over the patterned third hard mask 130 during an operation 402. The low temperature oxide layer 208 fills each of the openings 202 between each portion 204 of the third hard mask 130. The low temperature oxide layer 208 is grown to be formed completely over the patterned third hard mask 130, such that the low temperature oxide layer 208 encapsulates the patterned third hard mask 130. The portion 205 of the low temperature oxide layer 208 disposed within each of the openings 202 forms a reverse tone mask from the third hard mask 130. The low temperature oxide layer 208 directly contacts the top surface 136 of the second hard mask 128 as well as the sidewalls 206 and top surface 134 of the third hard mask 130.

The low temperature oxide layer 208 is sometimes referred to as an oxide layer 208. The low temperature oxide layer 208 includes a low temperature oxide material. The low temperature oxide layer 208 is deposited using a low-temperature process, such that the process volume and the substrate are heated to or maintained at a temperature of less than or about 400° C., such as less than or about 300° C., such as less than or about 200° C. The low temperature oxide layer 208 is deposited at a low temperature to reduce warpage of the layer stack 100 and the third hard mask 130. The low temperature oxide layer 208 is easy to reflow and assists in forming a planar top surface.

After depositing the low temperature oxide layer 208 during the operation 402, a photoresist layer 210 is deposited over the low temperature oxide layer 208 as shown in FIG. 2C. The photoresist layer 210 is a tri-layer photoresist layer, such that the photoresist layer 210 includes a bottom layer of a spin on carbon material, a back anti-reflection coating (BARC) or a silicon anti-reflection coating (SiARC) disposed on the spin on carbon material, and an extreme ultra violet (EUV) photoresist layer or metal resist layer disposed on top of the BARC/SiARC layer. The photoresist layer 210 is deposited on top of the low temperature oxide layer 208, such that the photoresist layer 210 is in contact with the low temperature oxide layer 208.

At least a portion of the photoresist layer 210 is exposed using a lithographic process during an operation 406. The exposure of the photoresist layer 210 includes exposing portions of the photoresist layer 210 to radiation. After exposure, the photoresist layer 210 includes a plurality of unexposed portions 212 and one or more exposed portions 214. The exposed portions 214 may be cross-linked during exposure and later removed if the photoresist layer 210 is a negative tone resist. In embodiments wherein the photoresist layer 210 is a positive tone resist, the exposed portions 214 and the unexposed portions 212 are switched and the unexposed portions 212 are removed.

Referring further to FIG. 2D, after exposing the photoresist layer 210, a portion, such as the exposed portion 214, of the photoresist layer 210 may be removed and a via 215 is etched through the opening formed within the photoresist layer 210 and the openings 202 within the third hard mask 130 during an operation 408. Etching the via 215 includes etching a portion of the low temperature oxide layer 208 disposed above two adjacent portions 204 of the third hard mask 130 as well as a portion of the low temperature oxide layer 208 disposed between sidewalls of two adjacent portions 204 of the third hard mask 130. The third hard mask 130 serves to align the via 215 etch and reduces the width of the via 215. The width of the via 215 is reduced from an upper portion 216 of the via 215 disposed above the third hard mask 130 to a lower portion 218 of the via 215 disposed between the sidewalls 206 of adjacent portions 204 of the third hard mask 130. Therefore, the upper portion 216 of the via 215 has a first width W. The first width $W_1$ is greater than about 12 nm, such as about 15 nm to about 25 nm, such as about 17 nm to about 23 nm, such as about 18 nm to about 20 nm. The lower portion 218 of the via 215 has a second width $W_2$. The second width $W_2$ is less than 75% of the first width $W_1$, such that the second width $W_2$ is about 50% of the first width $W_1$, such that the second width $W_2$ is considered a half-pitch of the pitch of the upper portion 216. The second width $W_2$ is less than or about 20 nm, such as less than or about 18 nm, such as less than or about 15 nm, such as less than or about 12 nm, such as less than or about 11 nm. The second width $W_2$ is the distance between the sidewalls 206 of adjacent portions 204 of the third hard mask 130. In some embodiments, when the first width $W_1$ is about 22 nm, such second width $W_2$ is about 11 nm and when the first width $W_1$ is about 18 nm, the second width $W_2$ is about 9 nm.

The lower portion 218 of the via 215 extends from the third hard mask 130, through the second hard mask layer 128, through the second metal layer 126, through the insulation layer 124, through the low-k layer 122, through the blocking layer 120, and through the first hard mask layer 108. The lower portion 218 of the via 215 extends to the first metal layer 106, such that a portion of the top surface of the first metal layer 106 is exposed or the via 215 is formed through a portion of the first metal layer 106. The via 215 is formed using one or more etch operations, such as a dry etch, a wet etch, or a plasma operation. After formation of the via 215, the photoresist layer 210 is removed via a selective etch or a development process operation. In some embodiments, the upper portion 216 of the via 215 is referred to as a first portion of the via 215 while the lower portion 218 of the via 215 is referred to as a second portion of the via 215.

Referring further to FIG. 2E, once the via 215 is etched to contact the first metal layer 106, a metal material is gap-filled into the lower portion 218 of the via 215 during an operation 410 to form an interconnect 220 between the first metal layer 106 and the second metal layer 126. The metal material is a similar material to the first metal layer 106 and/or the second metal layer 126. The metal material fills the lower portion 218 of the via 215 until the metal material reaches the second hard mask layer 128 or the third hard mask layer 130 as shown in FIG. 2E. Therefore, the metal material does not fill the upper portion 216 of the via 215. The metal material includes ruthenium, molybdenum, tungsten, alloys thereof, or any combination thereof. In some embodiments, the metal material is an alloy of one of ruthenium, molybdenum, or tungsten. In some embodiments, the metal material fills the entire lower portion 218 of the via 215. A metal etching process is used to adjust the height of the metal gapfill material in the via 215, such that the metal material is disposed below the top surface of the second hard mask layer 128 and the third hard mask layer 130, but within the second metal layer 126.

After the metal material fills the lower portion 218 of the via 215, the substrate 101 and the layer stack 100 are annealed during an operation 412. The anneal of the layer stack 100 includes heating the layer stack 100 and the substrate 101 to an anneal temperature of about 100° C. to about 700° C., such as about 200° C. to about 500° C., such as about 200° C. to about 400° C., such as about 300° C. to about 400° C. Annealing the layer stack 100 reduces the number of voids and grain boundaries within the interconnect 220, between the interconnect 220 and the first metal layer 106, and between the interconnect 220 and the second metal layer 126. The anneal operation may further reduce the resistivity of the interconnect 220 and the boundary between the interconnect 220 and either of the first metal layer 106 or the second metal layer 126. The annealing of the layer stack 110 may further reduce one or more of resistivity or stress within other layers formed during the method 300 of FIG. 3 and the method 400 of FIG. 4. The annealing of the layer stack 110 is performed after the formation of the via 216 and the filling of the via 215 with the metal material.

Referring further to FIG. 2F, after forming the interconnect 220 and annealing the layer stack 100, a low temperature oxide 222 is deposited into the unfilled portion of the via 215, such as the upper portion 216 of the via 215, during an operation 414. The low temperature oxide 222 deposited during the operation 414 is similar to the low temperature oxide 222 of the low temperature oxide layer 208 and fills the gap formed in the low temperature oxide layer 208 during the formation of the via 215 as shown in FIG. 2F. The low temperature oxide 222 fills the opening within the second hard mask layer 128 formed by the via 215. The low temperature oxide 222 further fills the opening formed between the sidewalls 206 of the third hard mask 130 during formation of the via 215.

After the low temperature oxide is utilized to fill the upper portion 216 of the via 215, an upper portion 223 of the low temperature oxide layer 208 is removed during an operation 416. Removing the upper portion 223 is performed using one or a combination of an etch operation or a polishing operation. In some embodiments, the upper portion 223 is removed using CMP. The upper portion 223 is the portion of the low temperature oxide layer 208 disposed above the third hard mask layer 130. The low temperature oxide layer 208 is removed until the top of the third hard mask 130 is exposed as shown in FIG. 2G. The top surfaces of the low temperature oxide layer 208 and the third hard mask 130 are co-planar, such that the low temperature oxide layer 208 forms a reverse tone hard mask from the third hard mask 130. The remaining portion 224 of the low temperature oxide layer 208 and the remaining portion 226 of the low temperature oxide introduced during the operation 414 form a patterned layer which is a reverse tone hard mask of the third hard mask 130.

Referring further to FIG. 2H, after formation of the patterned layer and the reverse tone hard mask, the remaining portions of the third hard mask 130 are removed during an operation 418. Removing the remaining portions of the third hard mask 130 reverses the pattern of the hard mask and leaves the remaining portions 224, 226 of the low temperature oxide layer 208 as the patterned layer. Removing the third hard mask 130 provides openings 230 between each of the remaining portions 224, 226.

Referring further to FIG. 2I, a portion of the second hard mask 128 and the second metal layer 126 are etched through the openings 230 of the reverse tone hard mask, formed by the low temperature oxide layer 208, during an operation 420. Etching the second metal layer 126 and the second hard mask 128 is performed using a selective etch process. The etching the second metal layer 126 and the second hard mask 128 is performed using a dry etch, a wet etch, or a plasma etch process. Etching the second hard mask 128 and the second metal layer 126 through the openings 230 forms a plurality of second features 232 as shown in FIG. 2I. The plurality of second features 232 include second metal features 234 and second hard mask features 236. The pattern of the second metal features 234 and the second hard mask features 236 is determined by the pattern of the temperature oxide layer 208. Each of the second features 232 are separated by a gap 238 disposed therebetween. In some embodiments, the plurality of first features 109 and the plurality of second features 232 form gratings within the layer stack 100. The plurality of second features 232 have a second feature pitch. The second feature pitch is less than or about 25 nm, such as less than or about 20 nm, such as less than or about 18 nm, such as less than or about 15 nm.

It is contemplated additional metal layers, low-k material layers, and hard masks may be utilized in addition to those illustrated herein. The additional metal layers, low-k material layers, and hard masks form larger stacks of interconnected metal layers.

The methods described herein enable a device structure with an interconnect 220 between a first metal layer 106 and a second metal layer 126 separated by one or more low-k material layers 122, 124. Each of the first metal layer 106 and the second metal layer 126 include a plurality of first features 109 or second features 232. The methods described herein enable self-alignment of the metal interconnect 220 with the first features 109 of the first metal layer 106 and the second features 232 of the second metal layer 126. The methods described herein further enable reduced interconnect 220 width.

Each of the deposition operations may be one or a combination of chemical vapor deposition (CVD), physical vapor deposition (PVD), plasma enhanced chemical vapor deposition (PE-CVD), and atomic layer deposition (ALD). In some embodiments, the layers are spray coated or spin coated onto the layer stack 100. Each of the etch or removal operations may be one or a combination of a wet etch, a dry etch, or a plasma etch. In some embodiments, one or more layers are removed using a development and dissolution process.

Embodiments of the present disclosure further relate to any one or more of the following examples:

1. A method of processing a substrate, suitable for semiconductor manufacturing, comprising: depositing a first oxide layer over a patterned hard mask layer; etching a first portion of a via through the first oxide layer and through an opening within the patterned hard mask layer; etching a second portion of the via through an upper metal layer and one or more low-k material layers to expose a portion of a lower metal layer, the one or more low-k material layers disposed between the upper metal layer and the lower metal layer; gap-filling the second portion of the via with a gapfill metal; filling the first portion of the via with a second oxide layer; removing a portion of the first oxide layer and the second oxide layer to form a patterned layer; removing the patterned hard mask layer to form openings within the patterned layer; and etching a portion of the upper metal layer through the openings within the patterned layer after removing the patterned hard mask layer.

2. The method according to example 1, wherein a first hard mask is disposed between the lower metal layer and the one or more low-k material layers and a second hard mask is disposed between the upper metal layer and the patterned hard mask layer.

3. The method according to example 2, wherein the first hard mask layer and the second hard mask layer are silicon nitride layers.

4. The method according to any one of examples 1-3, wherein the patterned hard mask layer is a titanium nitride or a tungsten carbide hard mask.

5. The method according to any one of examples 1-4, wherein the first portion of the via has a first width of about 15 nm to about 25 nm.

6. The method according to any one of examples 1-5, wherein the patterned hard mask layer comprises a plurality of features and each feature is separated by a second width of less than 15 nm.

7. The method according to any one of examples 1-6, wherein the second portion of the via is disposed between two adjacent features of the plurality of features.

8. The method according to any one of examples 1-7, wherein each of the upper metal layer, the lower metal layer, and the gapfill metal are the same.

9. The method according to any one of examples 1-8, wherein each of the upper metal layer, the lower metal layer, and the gapfill metal comprises ruthenium, molybdenum, tungsten, alloys thereof, or any combination thereof.

10. A method of processing a substrate, suitable for semiconductor manufacturing, comprising: depositing a low temperature oxide layer over a patterned hard mask layer, the patterned hard mask layer comprising a plurality of openings and the low temperature oxide layer disposed within the plurality of openings; etching a first portion of a via through the low temperature oxide and through an opening within the patterned hard mask layer; etching a second portion of the via through an upper metal layer, an insulating layer, a low-k layer, and a blocking layer to expose a portion of a lower metal layer; and gap-filling the second portion of the via with a gapfill metal to connect the upper metal layer and the lower metal layer.

11. The method according to example 10, further comprising: filling the first portion of the via with a second low temperature oxide after gap-filling the second portion; removing a portion of the low temperature oxide layer and the second low temperature oxide to form a patterned layer, wherein the low temperature oxide layer is disposed within gaps of the patterned hard mask layer; removing the patterned hard mask layer; and etching a portion of the upper metal layer through openings within the low temperature oxide layer after removing the patterned hard mask layer.

12. The method according to example 10 or 11, wherein the insulating layer is a Tetraethyl orthosilicate layer.

13. The method according to any one of examples 10-12, wherein the low-k layer has a dielectric constant of less than 4.

14. The method according to any one of examples 10-13, wherein the low-k layer comprises a silicon oxycarbide.

15. The method according to any one of examples 10-14, wherein the first portion of the via has a first width of about 15 nm to about 25 nm and the second portion of the via has a second width less than the first width and the second width is less than 15 nm.

16. The method according to any one of examples 10-15, wherein a photoresist layer is disposed over the low temperature oxide layer and is patterned, such that etching the via is performed through a portion of the photoresist layer.

17. The method according to any one of examples 10-16, wherein the blocking layer is an aluminum oxide layer.

18. A layer stack disposed on a substrate, suitable for use as a semiconductor, comprising: a first metal layer; a first hard mask layer disposed on the first metal layer; one or more low-k material layers disposed over the first hard mask layer; a second metal layer disposed over the one or more low-k material layers and the first hard mask layer; a second hard mask layer disposed over the second metal layer; an oxide layer disposed over the second hard mask layer, wherein each of the second metal layer, the second hard mask layer, and the oxide layer are patterned and form a plurality of features and wherein a gapfill metal connects the first metal layer and the second metal layer and is disposed through an opening within the first hard mask and the one or more low-k material layers.

19. The layer stack according to example 18, wherein the one or more low-k material layers comprises an insulating layer and a low-k layer.

20. The layer stack according to example 18 or 19, wherein the gapfill metal, the first metal layer, and the second metal layer comprise the same material.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise, whenever a composition, an element, or a group of elements is preceded with the transitional phrase "comprising", it is understood that the same composition or group of elements with transitional phrases "consisting essentially of", "consisting of", "selected from the group of consisting of", or "is" preceding the recitation of the composition, element, or elements and vice versa, are contemplated. As used herein, the term "about" refers to a +/−10% variation from the nominal value. It is to be understood that such a variation can be included in any value provided herein.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A method of processing a substrate, suitable for semiconductor manufacturing, comprising:
   depositing a first oxide layer over a patterned hard mask layer;

etching a first portion of a via through the first oxide layer and through an opening within the patterned hard mask layer;

etching a second portion of the via through an upper metal layer and one or more low-k material layers to expose a portion of a lower metal layer, the one or more low-k material layers disposed between the upper metal layer and the lower metal layer;

gap-filling the second portion of the via with a gapfill metal;

filling the first portion of the via with a second oxide layer;

removing a portion of the first oxide layer and the second oxide layer to form a patterned layer;

removing the patterned hard mask layer to form openings within the patterned layer; and etching a portion of the upper metal layer through the openings within the patterned layer after removing the patterned hard mask layer.

2. The method of claim 1, wherein a first hard mask is disposed between the lower metal layer and the one or more low-k material layers and a second hard mask is disposed between the upper metal layer and the patterned hard mask layer.

3. The method of claim 2, wherein the first hard mask layer and the second hard mask layer are silicon nitride layers.

4. The method of claim 1, wherein the patterned hard mask layer is a titanium nitride or a tungsten carbide hard mask.

5. The method of claim 1, wherein the first portion of the via has a first width of about 15 nm to about 25 nm.

6. The method of claim 1, wherein the patterned hard mask layer comprises a plurality of features and each feature is separated by a second width of less than 15 nm.

7. The method of claim 6, wherein the second portion of the via is disposed between two adjacent features of the plurality of features.

8. The method of claim 1, wherein each of the upper metal layer, the lower metal layer, and the gapfill metal are the same.

9. The method of claim 8, wherein each of the upper metal layer, the lower metal layer, and the gapfill metal comprises ruthenium, molybdenum, tungsten, alloys thereof, or any combination thereof.

10. A method of processing a substrate, suitable for semiconductor manufacturing, comprising:

depositing a low temperature oxide layer over a patterned hard mask layer, the patterned hard mask layer comprising a plurality of openings and the low temperature oxide layer disposed within the plurality of openings;

etching a first portion of a via through the low temperature oxide and through an opening within the patterned hard mask layer;

etching a second portion of the via through an upper metal layer, an insulating layer, a low-k layer, and a blocking layer to expose a portion of a lower metal layer; and gap-filling the second portion of the via with a gapfill metal to connect the upper metal layer and the lower metal layer.

11. The method of claim 10, further comprising:

filling the first portion of the via with a second low temperature oxide after gap-filling the second portion;

removing a portion of the low temperature oxide layer and the second low temperature oxide to form a patterned layer, wherein the low temperature oxide layer is disposed within gaps of the patterned hard mask layer;

removing the patterned hard mask layer; and etching a portion of the upper metal layer through openings within the low temperature oxide layer after removing the patterned hard mask layer.

12. The method of claim 10, wherein the insulating layer is a Tetraethyl orthosilicate layer.

13. The method of claim 10, wherein the low-k layer has a dielectric constant of less than 4.

14. The method of claim 13, wherein the low-k layer comprises a silicon oxycarbide.

15. The method of claim 10, wherein the first portion of the via has a first width of about 15 nm to about 25 nm and the second portion of the via has a second width less than the first width and the second width is less than 15 nm.

16. The method of claim 10, wherein a photoresist layer is disposed over the low temperature oxide layer and is patterned, such that etching the via is performed through a portion of the photoresist layer.

17. The method of claim 10, wherein the blocking layer is an aluminum oxide layer.

* * * * *